United States Patent
Roy et al.

(10) Patent No.: US 9,607,663 B2
(45) Date of Patent: Mar. 28, 2017

(54) NON-VOLATILE DYNAMIC RANDOM ACCESS MEMORY (NVDRAM) WITH PROGRAMMING LINE

(71) Applicant: FREESCALE SEMICONDUCTOR, INC., Austin, TX (US)

(72) Inventors: Anirban Roy, Austin, TX (US); Michael A. Sadd, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/823,698

(22) Filed: Aug. 11, 2015

(65) Prior Publication Data

US 2017/0047098 A1 Feb. 16, 2017

(51) Int. Cl.
*G11C 5/06* (2006.01)
*G11C 14/00* (2006.01)

(52) U.S. Cl.
CPC ............ *G11C 5/06* (2013.01); *G11C 14/0009* (2013.01)

(58) Field of Classification Search
CPC ............................... G11C 5/06; G11C 14/0009
USPC .......................................................... 365/72
See application file for complete search history.

(56) References Cited

U.S. PATENT DOCUMENTS

| | | | |
|---|---|---|---|
| 5,196,722 A | 3/1993 | Bergendahl et al. | |
| 5,617,349 A * | 4/1997 | Koike | G11C 11/22 365/145 |
| 5,640,030 A * | 6/1997 | Kenney | G11C 11/5657 257/295 |
| 5,689,456 A * | 11/1997 | Kobayashi | G11C 11/22 257/295 |
| 6,097,629 A | 8/2000 | Dietrich et al. | |
| 6,556,487 B1 | 4/2003 | Ratnakumar et al. | |
| 7,054,194 B2 | 5/2006 | Liaw et al. | |
| 7,795,659 B2 | 9/2010 | Yoon et al. | |
| 7,944,734 B2 | 5/2011 | Lamorey | |
| 8,519,462 B2 | 8/2013 | Wang et al. | |
| 8,635,511 B2 | 1/2014 | Takeuchi et al. | |
| 2005/0017285 A1 | 1/2005 | Tzeng et al. | |
| 2006/0054955 A1 | 3/2006 | Kim | |
| 2011/0294291 A1 | 12/2011 | Matsui et al. | |
| 2013/0077382 A1 | 3/2013 | Cho et al. | |

OTHER PUBLICATIONS

U.S. Appl. No. 14/501,781, Roy, A., "Non-Volatile Random Access Memory (NVRAM)", filed Sep. 30, 2014, Office Action—Restriction, mailed on Oct. 15, 2015.
Fukumoto et al, "A 256K-Bit Non-Volatile PSRAM with Page Recall and Chip Store", 1991 Symposium on VLSI Circuits Digest of Technical Papers, May 30-Jun. 1, 1991, pp. 91-92, Oiso, Japan.
U.S. Appl. No. 14/501,781, filed Sep. 30, 2014.

(Continued)

*Primary Examiner* — Tha-O H Bui

(57) ABSTRACT

A memory circuit includes a first bit line, a second bit line, and a memory cell that is coupled to first bit line and the second bit line. The memory cell includes a capacitor, a first pass gate transistor, a non-volatile (NV) element, and a second pass gate transistor. The first capacitor has a first terminal coupled to a first storage node and a second terminal coupled to a reference. The first pass gate transistor is coupled between the first bit line and the first storage node. The NV element and a second pass gate transistor are coupled in series, wherein the first NV element and the second pass gate transistor are coupled between the first storage node and the first program line.

18 Claims, 3 Drawing Sheets

(56) References Cited

OTHER PUBLICATIONS

Abe et al, "Novel Hybrid DRAM/MRAM Design for Reducing Power of High Performance Mobile CPU", IEEE International Electron Devices Meeting (IEDM), Dec. 10-13, 2012, pp. 10.5.1-10.5.4, San Francisco, CA.

Calderoni et al, "Performance comparison of O-based and Cu-based ReRAM for high-density applications", IEEE 6th International Memory Workshop (IMW), May 18-21, 2014, pp. 5-8, Taipei.

Noguchi et al, "D-MRAM cache: Enhancing energy efficiency with 3T-1MTJ DRAM/MRAM hybrid memory", Design, Automation & Test in Europe Conference & Exhibition, Mar. 18-22, 2013, pp. 1813-1818, Grenoble, France.

Tanaka et al, "Normally-off type nonvolatile static random access memory with perpendicular spin torque transfer-magnetic random access memory cells and smallest number of transistors", Japanese Journal of Applied Physics 53, Mar. 18, 2014, pp. 1-4.

Keeth, B., et al., "DRAM Circuit Design: Fundamental and High-Speed Topics", 2nd Edition, Dec. 2007, 440 pages (pp. 33-45 as relevant to this application).

Fackenthal, R., et al., "A 16Gb ReRAM with 200MB/s Write and 16B/s Read in 27nm Technology", 2014 IEEE International Solid-State Circuits Conference, San Francisco, CA, pp. 338-340.

Non-final office action dated Jan. 13, 2016 in U.S. Appl. No. 14/501,781.

Final office action dated Jul. 20, 2016 in U. S. Appl. No. 14/501,781.

\* cited by examiner

US 9,607,663 B2

NON-VOLATILE DYNAMIC RANDOM ACCESS MEMORY (NVDRAM) WITH PROGRAMMING LINE

BACKGROUND

Field

This disclosure relates generally to integrated circuits, and more particularly, to non-volatile dynamic random access memories (NVDRAMs).

Related Art

Non-volatile memories (NVMs) have become very important in a variety of applications but NVMs typically are slower than other types of memories. Thus it is common to have both NVMs and random access memories (RAMs) on the same integrated circuit because normal operations typically do not require the non-volatile feature. One approach is to combine the non-volatile feature with RAM characteristics. For example, the non-volatile feature is used rarely, such as at power-up and power-down, and the RAM characteristic is used otherwise. The RAM characteristic can be for both interfacing with non-volatile feature for simply a portion of the general purpose RAM. Often the RAM is a static RAM (SRAM), but it can be beneficial for the RAM to be a dynamic RAM (DRAM) due to the smaller size. If general purpose DRAM is going to be present on the integrated circuit anyway, then the use of DRAM cells in combination with NVM cells may be more efficient due to the smaller size than using SRAMs in combination with the NVM cells. Arranging a memory that has both the DRAM characteristic and the NVM characteristic in a manner that is effective in reliably achieving the desired operating characteristics without requiring excessive space has been found to be challenging.

Accordingly there is a need to provide further improvement in obtaining NVDRAMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a non-volatile dynamic random access memory cell has a capacitor coupled to a storage node located between a transistor and series combination of a non-volatile element and a transistor. The series combination is coupled to a programming line and the other to a bit line. This is better understood by reference to the drawings and the following written description.

Figure 1:
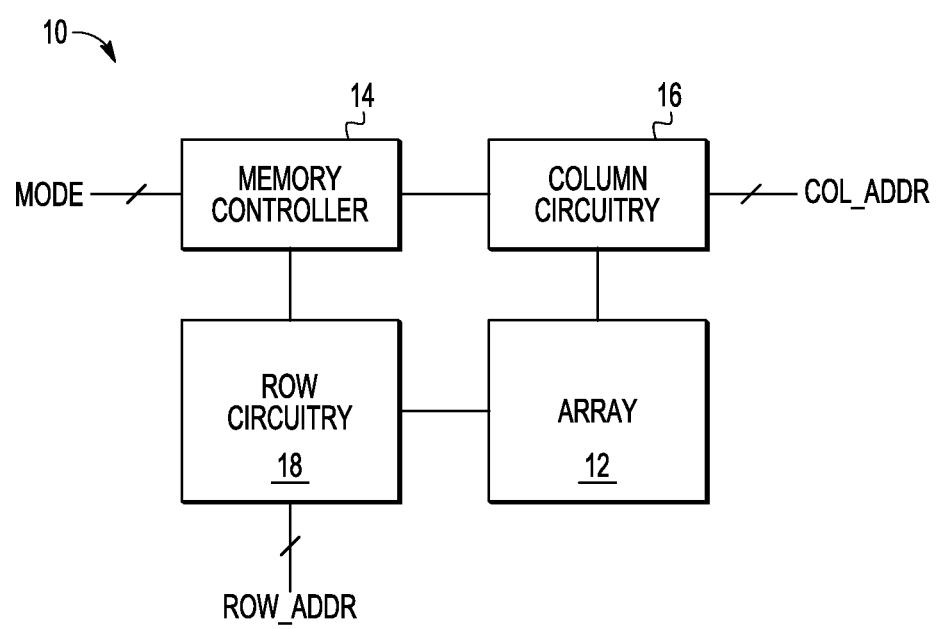
FIG. 1 illustrates, in simplified block diagram form, a memory system in accordance with an embodiment of the present disclosure.

Shown in FIG. 1 is memory system 10 including a memory array 12, a memory controller 14, column circuitry 16 coupled to memory array 12 and memory controller 14, and row circuitry 18 coupled to memory controller 14 and array 12. Memory controller 14 controls the operations of column circuitry 16 and row circuitry 18. Row circuitry 18 provides row functions such as row selection and word line driving under the control of memory controller 14. Column circuitry 16 provides column functions such as column selection, sensing along bit lines, reading, and providing write data.

Figure 2:
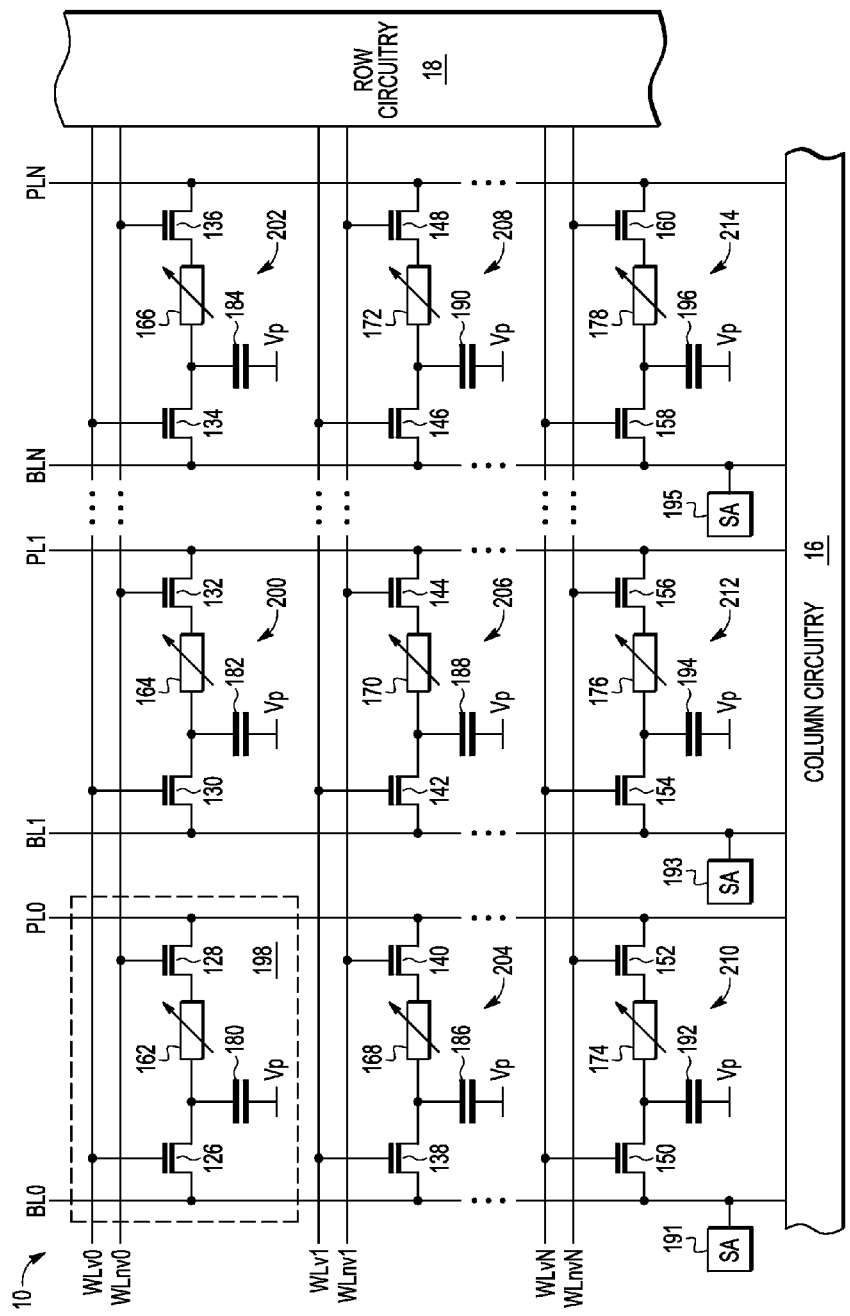
FIG. 2 illustrates, in simplified schematic form, a non-volatile dynamic random access memory (NVDRAM) memory array including row and column circuitry in accordance with an embodiment of the present disclosure.

Shown in FIG. 2 is memory system 10 without memory controller 14 with memory array 12 shown in more detail. Shown in FIG. 2, memory array has bit lines BL0, BL1, and BLn; program lines PL0, PL1, and PLN; volatile word lines WLv0, WLv1, and WLvN; non-volatile word lines WLnv0, WLnv1, and WLnvN; and NVDRAM cells 198, 200, 202, 204, 206, 208, 210, 212, and 214. NVDRAM cell 198 has a transistor 126, which may be N channel, a capacitor 180, a non-volatile (NV) element 162, and a transistor 128, which may be N channel. NVDRAM cell 200 has transistors 130 and 132, a capacitor 182, and an NV element 164. NVDRAM cell 202 has transistors 134 and 136, a capacitor 184, and an NV element 166. NVDRAM cell 204 has transistors 138 and 140, a capacitor 186, and an NV element 168. NVDRAM cell 206 has transistors 142 and 144, a capacitor 188, and an NV element 170. NVDRAM cell 208 has transistors 146 and 148, a capacitor 190, and an NV element 172. NVDRAM cell 210 has transistors 150 and 152, a capacitor 192, and an NV element 174. NVDRAM cell 212 has transistors 154 and 156, a capacitor 184, and an NV element 176. NVDRAM cell 214 has transistors 158 and 160, a capacitor 196, and an NV element 178.

Figure 3:
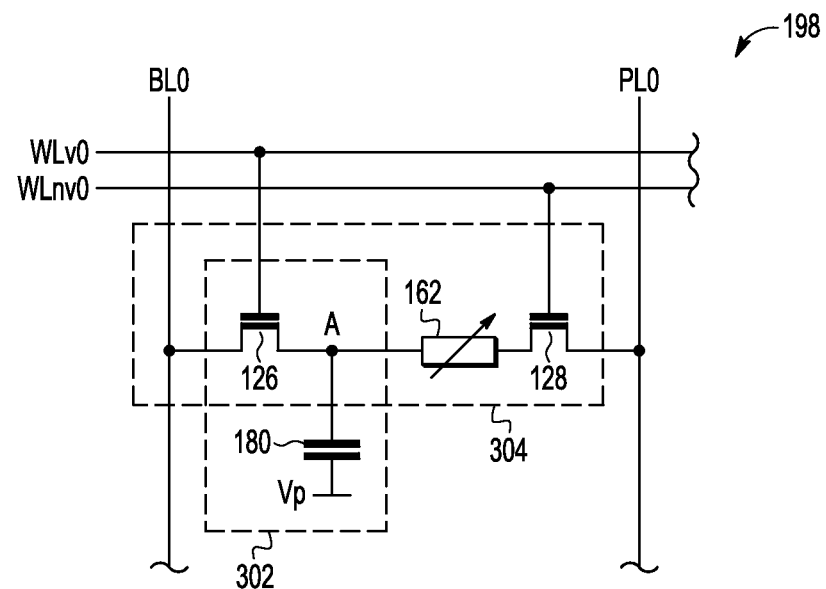
FIG. 3 illustrates, in simplified schematic form, an NVDRAM cell in accordance with an embodiment of the present disclosure.

Using NVDRAM cell 198, shown separately in FIG. 3, as the example for NVDRAM cells 200, 202, 204, 206, 208, 210, 212, and 214, as well as many other NVDRAMs not shown, transistor 126 has a first current electrode connected to bit line BL0, a control electrode coupled to word line WLv0, and a second current electrode coupled to a node A. Capacitor 180 has a first terminal connected to node A and a second terminal connected to a reference voltage Vp, which may be ground. Sometimes it is advantageous to use a higher voltage such as half the power supply voltage. Capacitor 180 and transistor 126 together form a DRAM cell 302. NV element 162 has a first terminal connected to node A and a second terminal. NV element 162 is formed in a direction in which it is written to a higher resistance when current flows from its first terminal, which is connected to node A, to its second terminal to a lower resistance when current flows from its second terminal to node A. Transistor 128 has a first current electrode connected to the second terminal of NV element 162, a gate connected to NV word line WLnv0, and a second current electrode connected to program line PL0. For the NV operation of NVDRAM cell 198, transistors 126 and 128, and NV element 162 are used so that the non-volatile memory (NVM) 304 includes transistors 126 and 128 and NV element 162.

The gates of transistors 130, 134, 138, 142, 146, 150, 154, and 158, which are analogous to transistor 126, are connected to word lines WLv0, WLv0, and WLv1, WLv1, WLv1, WLvN, WLvN, and WLvN respectively. The gates of transistors 132, 136, 140, 144, 148, 152, 156, and 160, which are analogous to transistor 128, are connected to NV word lines WLnv0, WLnv0, WLnv1, WLnv1, WLnv1, WLnvN, WLnvN, and WLnvN respectively. The first current electrodes of transistors 130, 134, 138, 142, 146, 150, 154, and 158 are coupled to bit lines BL1, BLN, BL0, BL1, BLN, BL0, BL1, and BLN, respectively. The second current electrodes of transistors 132, 136, 140, 144, 148, 152, 156, and 160 are coupled to program lines PL1, PLN, PL0, PL1, PLN, PL0, PL1, PLN, respectively. The second current electrodes of transistors 130, 134, 138, 142, 146, 150, 154, and 158 are coupled to the first terminals of NV elements 164, 166, 168, 170, 172, 174, 176, and 178, respectively. The first current electrodes of transistors 132, 136, 140, 144, 148, 152, 156, and 160 are coupled to the second terminals of NV elements 164, 166, 168, 170, 172, 174, 176, and 178, respectively. The first terminals of capacitors 182, 184, 186, 188, 190, 192, 194, and 196 are coupled to the first current electrodes of transistors 130, 134, 138, 142, 146, 150, 154, and 158, respectively. The second terminals of capacitors 182, 184, 186, 188, 190, 192, 194, and 196 are coupled to reference voltage Vp. Bit lines BL0, BL1, and BLN and program lines PL0, PL1, and PLN are coupled to column circuitry 16. Word lines WLv0, WLv1, and WLvN and NV word lines WLnv0, WLnv1, and WLnvN are coupled to row circuitry 18.

Operation of NVDRAM cells 198, 200, 202, 204, 206, 208, 210, 212, and 214 includes reading, writing, store, and restore. Using NVDRAM 12 for reading is achieved by row circuitry 18 asserting a logic high on word line WLv0, selected by the row portion of the address, which causes transistor 126 to become conductive which couples node A to bit line BL0 so that the logic state of node A is thereby coupled to bit line BL0. Column circuitry 16 couples bit line BL0 as selected by a portion of the column address to read circuitry inside column circuitry 16, which senses the logic state on bit line BL0 and provides a corresponding output.

Writing into NVDRAM cell 198 is achieved by writing into node A of DRAM cell 302 by reversing the process of reading. An input signal is routed to bit line BL0 by column circuitry 16. Word line WL0 is asserted with a logic high that causes transistor 126 to be conductive which results in bit line BL0 being coupled to node A so that logic state present on bit line BL0 becomes present on node A of NVDRAM cell 198. During normal read and write operations, NV word line WLnv0 is a logic low keeping transistor 128 non-conductive.

A store operation is for the case in which a desired logic state is to be stored in NV element 162. If the logic state to be stored in NV element 162 is a logic low, then NV element 162 is programmed to the relatively low resistance. This is achieved by applying a logic high on program line PL0, a logic high on word line WLv0, and a logic low on bit line BL0. This forces current through NV element 162 from program line PL0 to bit line BL0, which is the direction or causing NV element to become relatively low resistance. If the logic state to be written into NV element 162 is a logic high, a logic high is applied to bit line BL0, word line WLv0, and NV word line WLnv0, and a logic low is applied to program line PL0. This results in current flowing from bit line BL0 to program line PL0 which is the direction of current which causes NV element to become relatively higher resistance and thus a logic high. If the store operation is to convert the volatile information in DRAM cell 302, then the logic state of DRAM cell 302 is first read and stored in column circuitry 16. That stored logic state is then written into NV element 162.

For a restore operation in which the logic state, which is established by the non-volatile elements, is to be written into DRAM cell 302, DRAM cell 302 is precharged to a logic high through bit line BL0. Word line WLv0 is a logic high causing the logic high on bit line BL0 to be coupled to node A through transistor 126. Word line WLv0 switches to a logic low causing transistor 126 to be non-conductive leaving a logic high on node A. Program line PL0 is brought to a voltage below the logic high voltage and NV word line WLnv0 provides a logic high pulse causing transistor 128 to become temporarily conductive. The voltage present on node A thus is reduced while transistor 128 is conductive with the reduction being related to the logic state of NV element 162. A lower resistance of a logic low causes a greater voltage drop in voltage on node A than the higher resistance of a logic high. Then a read of DRAM cell 302 is performed by applying a logic high to word line WLv0 which causes transistor 126 to couple node A to bit line BL0. The read, which is performed by column circuitry 16 on bit line BL0, determines if the NV element was programmed to the logic high or the logic low condition.

Figure 4:
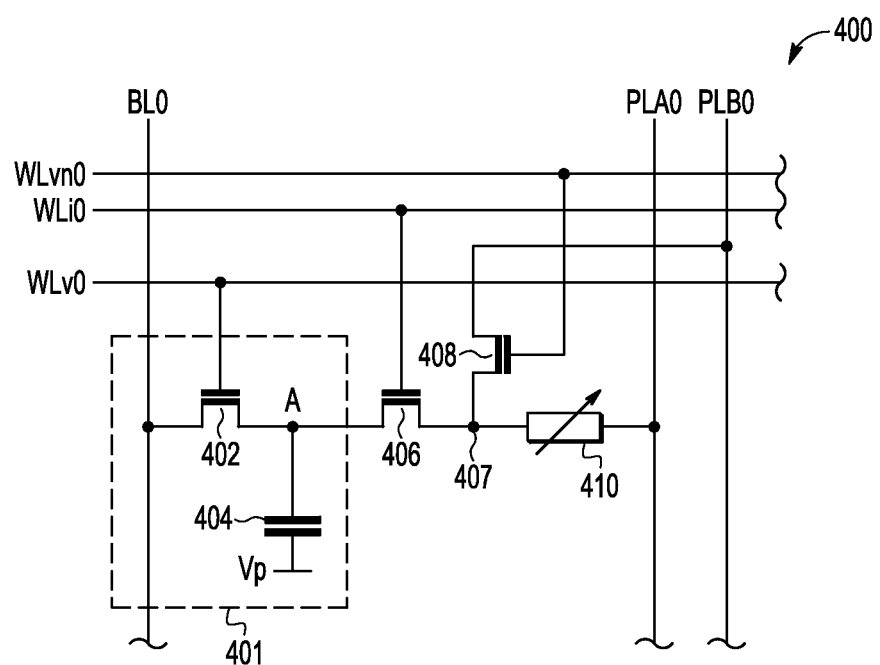
FIG. 4 illustrates, in simplified schematic form, another NVDRAM cell in accordance with an embodiment of the present disclosure.

Shown in FIG. 4 is an NVDRAM cell 400 representative of a cell that can replace the NVDRAM cells of memory array 12 such as NVDRAM cells 198-214 with some additional functionality from row circuitry 18 and column circuitry 16 by replacing program line PL0 with a pair of program lines PLA0 and PLB0 from column circuitry 16 and adding an isolation word line WLi0 from row circuitry 18. NVDRAM cell 400 includes a DRAM cell 401 like DRAM cell 302. DRAM cell 401 has a transistor 402, which may be N channel, and a capacitor 404. NVDRAM 400 further includes a transistor 406, which may be N channel, a transistor 408, which may be N channel, and an NV element 410. Transistor 402 has a gate connected to a word line WLv0, a first current electrode connected to a bit line BL0, and a second current electrode coupled to a node A. Capacitor 404 has a first terminal connected to node A and a second terminal connected to a reference voltage which may be ground or another effective voltage, for example, half the power supply voltage. Transistor 406 has a first current electrode connected to node A, a control electrode connected to isolation word line WLi0, and a second current electrode connected to a programming node 407. Transistor 408 has a first current electrode connected to the second current electrode of transistor 406 at node 407, a second current electrode connected to program line PLB0, and a control electrode connected to an NV word line WLnv0. NV element 410 has a first terminal connected to the second terminal of transistor 406 at node 407 and the first terminal of transistor 408 and a second terminal connected to program line PLA0.

As for NVDRAM cell 198, operations for NVDRAM cell 400 include reading, writing, store, and restore. Using NVDRAM cell 400 for reading is achieved by row circuitry 18 asserting a logic high on word line WLv0, selected by the row portion of the address, which causes transistor 402 to become conductive which couples node A to bit line BL0 so that the logic state of node A is thereby coupled to bit line BL0. Non-volatile word line WLnv0 and isolation word line WLi0 are deasserted with logic lows so that transistors 406 and 408 are non-conductive. Bit line BL0, as selected by a portion of the column address, is coupled to read circuitry, which would be present in column circuitry, which would sense the logic state on bit line BL0, and which would provide a corresponding output.

Writing into DRAM cell 401 of NVDRAM cell 400 is achieved by writing into node A of DRAM cell 401 by reversing the process of reading. An input signal is routed to bit line BL0. Word line WvL0 is asserted with a logic high that causes transistor 402 to be conductive which results in bit line BL0 being coupled to node A so that logic state present on bit line BL0 becomes present on node A of NVDRAM cell 198. During normal read and write operations, NV word line WLnv0 and isolation word line WLi0 is a logic low keeping transistors 406 and 408 non-conductive.

For a store operation in which NV element 410 is to be written, isolation word line WLi0 is a logic low so that transistor 406 is non-conductive. This isolates NV element 410 from node A so that normal read and write operations can continue on DRAM cell 401 during the store operation. Non-volatile word line WLnv is a logic high so that transistor 408 is conductive. For writing a logic high program line PLA0 is a logic low and program line PLB0 is a logic low so that current flows through NV element in the direction that results in the relatively high resistance. For writing a logic low, line PLA0 is a logic high and line PLB0 is a logic low so that current flows through NV element 410 in the direction that results in the relatively low resistance. The node that is the common connection of transistors 406 and 408 and NV element 410 may be referenced as a programming node.

For a restore operation, the logic state of NV element 410 is written into DRAM cell 401. A logic high is written onto node A with isolation word line WLi0 and NV word line WLnv0 at a logic low, program line PLA0 is a logic low, and program line PLB0 is at a high impedance. In this situation, transistor 408 does not affect the operation. A pulse is applied to isolation word line WLi0 to provide enough discharge of node A so that node A can be recognized as a logic low if NV element 410 is in the relatively low resistance state. On the other hand, if NV element 410 is in the relatively high resistance state, the discharge will be sufficiently small so that node A can be recognized as a logic high. The voltage and duration of the pulse can be adjusted to achieve this needed differential in discharge based on the higher or lower resistance of NV element 410.

Thus it is seen that an NV cell and a DRAM cell can be combined to form a NVDRAM in an efficient manner.

By now it should be appreciated that there has been disclosed a memory circuit having a first bit line, a first program line, and a first memory cell. The first memory cell is coupled to the first bit line and the first program line. The first memory cell includes a first capacitor having a first terminal coupled to a first storage node and a second terminal coupled to a reference. The first memory cell further includes a first pass gate transistor coupled between the first bit line and the first storage node. The first memory cell further includes a first non-volatile (NV) element and a second pass gate transistor coupled in series, wherein the first NV element and the second pass gate transistor are coupled between the first storage node and the first program line. The memory circuit may further include column circuitry coupled to the first bit line that senses a logic state based on charge stored at the first storage node in a first mode and based on a resistance of the first NV element in a second mode. The memory may have a further characterization by which the second pass gate transistor couples the second terminal of the first NV element to the first program line in the second mode. The memory may have a further characterization by which the second pass gate transistor decouples the second terminal of the first NV element from the first program line in the first mode. The memory may have a further characterization by which, in the second mode, a program transistor couples the second terminal of the first NV element to the first program line for a predetermined time while the second pass gate transistor is disabled. The memory may have a further characterization by which the control circuitry detects, in the first mode, a logic state of the first memory cell a predetermined time after the first pass gate transistor couples the first storage node to the first bit line. The memory may have a further characterization by which the first NV element is programmed to a first logic state by passing current from the first bit line to the first program line through the first pass gate transistor, the second pass gate transistor, and the NV element. The memory may have a further characterization by which the first NV element is programmed to a second logic state by passing current from the first program line to the first bit line through the first pass gate transistor, the second pass gate transistor, and the NV element. The memory may have a further characterization by which. The memory circuit may further include a programming transistor having a first current electrode coupled to a second program line, a control electrode coupled to a third word line, and a control electrode coupled to a programming node between the second pass gate transistor and the NV element. The memory may have a further characterization by which a programming current passes between the second program line and the first program line through the programming transistor and the NV element.

Also disclosed is a method of operating a memory circuit having a first memory cell having a capacitor and a non-volatile (NV) element, wherein the first memory cell is coupled to a first bit line and a first program line. The method includes programming the first memory cell by selectively applying current between the first program line and through the NV element to establish a logic state of the NV element. The method further includes writing the first memory cell by applying a voltage to the first bit line while coupling the first bit line to the capacitor to store charge based on the voltage in the capacitor. The method further includes restoring the logic state of the NV element to the first memory cell by drawing current between the NV element and the first program line for a predetermined time. The method may further include reading a logic state of the first memory cell by coupling the first bit line to the capacitor and decoupling the first program line from the NV element. The method may have a further characterization by which the coupling the first bit line to the capacitor comprises enabling a first pass gate transistor that is coupled between the capacitor and the first bit line. The method may have a further characterization by which the reading the logic state of the first memory cell further comprises using control circuitry coupled to the first bit line. The method may further include storing data in the first memory cell by selecting the current for programming the NV element based on the logic state read by the control circuitry. The method may have a further characterization by which programming is further characterized as passing current between the first bit line and the first program line through the NV element. The method may have a further characterization by which the memory circuit further comprises a second program line, wherein programming is further characterized as passing current between the first and second program lines through the NV element.

Disclosed also is a memory circuit including a first bit line, a first program line, and a first memory cell that is coupled to the first bit line and the first program line. The first memory cell includes a first DRAM cell coupled to the first bit line, wherein the first DRAM cell has a storage node. The first memory cell further includes a first non-volatile (NV) element and a pass gate transistor coupled in series, wherein the first NV element and the pass gate transistor are coupled between the storage node and the first program line. The memory circuit has a further characterization by which, in a restore mode of the memory circuit, current is drawn through the first NV element for a predetermined time. The memory circuit may have a further characterization by which programming of the NV element occurs by passing current between the first bit line and the first program line through the NV element. The memory circuit may further include a programming transistor coupled between a programming node between the pass gate transistor and the first NV element and a second program line wherein programming of the NV element occurs by passing current between the first and second program lines.

Although the invention is described herein with reference to specific embodiments, various modifications and changes can be made without departing from the scope of the present invention as set forth in the claims below. For example, the particular type of non-volatile element can vary from the disclosed type. Also the terms logic low and logic high can be arbitrary and can be reversed in proper circumstances. For example a low resistance could be considered a logic high and a high resistance a logic low. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory circuit, comprising:
    a first bit line;
    a first program line;
    a first memory cell, coupled to the first bit line and the first program line, comprising:
        a first capacitor having a first terminal coupled to a first storage node and a second terminal coupled to a reference;
        a first pass gate transistor coupled between the first bit line and the first storage node; and
        a first non-volatile (NV) element and a second pass gate transistor coupled in series, wherein the first NV element and the second pass gate transistor are coupled between the first storage node and the first program line; and
    a programming transistor having a first current electrode coupled to a second program line, a control electrode coupled to a word line, and a second current electrode coupled to a programming node between the second pass gate transistor and the NV element.

2. The memory circuit of claim 1, further comprising:
    column circuitry coupled to the first bit line that senses a logic state based on charge stored at the first storage node in a first mode and based on a resistance of the first NV element in a second mode.

3. The memory circuit of claim 2, wherein the second pass gate transistor couples the second terminal of the first NV element to the first program line in the second mode.

4. The memory circuit of claim 3, wherein the second pass gate transistor decouples the second terminal of the first NV element from the first program line in the first mode.

5. The memory of claim 2, wherein, in the second mode, the programming transistor couples the second terminal of the first NV element to the first program line for a predetermined time while the second pass gate transistor is disabled.

6. The memory circuit of claim 2, wherein the control circuitry detects, in the first mode, a logic state of the first memory cell a predetermined time after the first pass gate transistor couples the first storage node to the first bit line.

7. The memory circuit of claim 2, wherein the first NV element is programmed to a first logic state by passing current from the first bit line to the first program line through the first pass gate transistor, the second pass gate transistor, and the NV element.

8. The memory circuit of claim 7, wherein the first NV element is programmed to a second logic state by passing current from the first program line to the first bit line through the first pass gate transistor, the second pass gate transistor, and the NV element.

9. The memory circuit of claim 1, wherein a programming current passes between the second program line and the first program line through the programming transistor and the NV element.

10. A method of operating a memory circuit having a first memory cell having a capacitor and a non-volatile (NV) element, wherein the first memory cell is coupled to a first bit line and a first program line, comprising:
    programming the first memory cell by selectively applying current between the first program line and through the NV element to establish a logic state of the NV element;
    writing the first memory cell by applying a voltage to the first bit line while coupling the first bit line to the capacitor to store charge based on the voltage in the capacitor; and
    restoring the logic state of the NV element to the first memory cell by drawing current between the NV element and the first program line for a predetermined time.

11. The method of claim 10, further comprising:
    reading a logic state of the first memory cell by coupling the first bit line to the capacitor and decoupling the first program line from the NV element.

12. The method of claim 11, wherein the coupling the first bit line to the capacitor comprises enabling a first pass gate transistor that is coupled between the capacitor and the first bit line.

13. The method of claim 10, wherein the reading the logic state of the first memory cell further comprises using control circuitry coupled to the first bit line.

14. The method of claim 13, further comprising storing data in the first memory cell by selecting the current for programming the NV element based on the logic state read by the control circuitry.

15. The method of claim 10, wherein programming is further characterized as passing current between the first bit line and the first program line through the NV element.

16. The method of claim 10, wherein the memory circuit further comprises a second program line, wherein programming is further characterized as passing current between the first and second program lines through the NV element.

17. A memory circuit, comprising:
- a first bit line;
- a first program line;
- a first memory cell, coupled to the first bit line and the first program line, comprising:
  - a first DRAM cell coupled to the first bit line, wherein the first DRAM cell has a storage node; and
  - a first non-volatile (NV) element and a pass gate transistor coupled in series, wherein the first NV element and the pass gate transistor are coupled between the storage node and the first program line; and
- a programming transistor coupled between a programming node between the pass gate transistor and the first NV element and a second program line wherein programming of the NV element occurs by passing current between the first and second program lines;
- wherein, in a restore mode of the memory circuit, current is drawn through the first NV element for a predetermined time.

18. The memory circuit of claim 17, wherein programming of the NV element occurs by passing current between the first bit line and the first program line through the NV element.

* * * * *